United States Patent [19]

Liu et al.

[11] Patent Number: 5,768,200

[45] Date of Patent: Jun. 16, 1998

[54] CHARGING A SENSE AMPLIFIER

[75] Inventors: Lawrence Liu, Menlo Park, Calif.;
Michael Murray, Bellevue, Wash.;
Li-Chun Li, Los Gatos, Calif.

[73] Assignee: Mosel Vitelic Corporation, San Jose, Calif.

[21] Appl. No.: 760,121

[22] Filed: Dec. 3, 1996

[51] Int. Cl.⁶ ............................................. G11C 7/00
[52] U.S. Cl. .................... 365/203; 365/189.11; 365/204
[58] Field of Search .................................. 365/203, 204, 365/205, 189.11

[56] References Cited

U.S. PATENT DOCUMENTS

| | | | |
|---|---|---|---|
| 5,313,434 | 5/1994 | Abe | 365/203 |
| 5,367,488 | 11/1994 | An | 365/203 |
| 5,477,498 | 12/1995 | Ooishi | 365/203 |
| 5,539,279 | 7/1996 | Takeuchi et al. | 365/203 |

*Primary Examiner*—Son T. Dinh
*Attorney, Agent, or Firm*—Skjerven, Morrill, MacPherson, Franklin & Friel; Michael Shenker

[57] ABSTRACT

A sense amplifier charging circuit can work with different power supply voltages (EVCC). When EVCC is high, a signal generated from EVCC disables some of the charging transistors to reduce the circuit noise. When EVCC is low, the signal generated from EVCC enables the transistors thus increasing the circuit speed.

14 Claims, 2 Drawing Sheets

CHARGING A SENSE AMPLIFIER

BACKGROUND OF THE INVENTION

The present invention relates to electrical circuits including sense amplifiers and memories having sense amplifiers.

Different electrical circuits are powered by different power supply voltages. For example, to reduce power consumption in battery operated computers, such computers are made with circuits powered by lower power supply voltages. At the same time, non-battery-operated computer circuits are powered by higher power supply voltages to increase circuit speeds. Therefore, computer circuit manufacturers, for example, memory manufacturers, have to produce circuits that can be powered by higher power supply voltages and circuits that can be powered by lower power supply voltages. To reduce the manufacturing costs, it is desirable to develop circuits, including memories and sense amplifier charging circuits in memories, that could be easily adapted to different power supply voltages.

It is also desirable to provide reliable circuit operation when a power supply voltage level varies during operation. The power supply voltage may vary, for example, due to temperature variations or current surges.

SUMMARY

The present invention provides circuits which can be used with different power supply voltages and which operate reliably in the presence of power supply voltage variations. These circuits include sense amplifier charging circuits for memories. Some circuits are suitable for dynamic random access memories (DRAMs).

Adapting a circuit to both high and low power supply voltages can be difficult because of a conflict between high speed and low noise requirements. Circuits made for low power supply voltages may include larger transistors to achieve high speed. However, if such a circuit is used with a high power supply voltage, the transistor switching may generate excessive noise. One solution to this problem is to have several transistors connected in parallel such that the transistors' combined size is sufficient to provide required speed in low power supply voltage operation. A fuse or a metal mask option disables one or more transistors if the circuit is to be used with a high power supply voltage.

In some embodiments of the present invention, the fuse and mask options are not needed because the transistors that need to be disabled are disabled by a signal generated from the power supply voltage. This signal disables the transistors when the power supply voltage is higher than a predetermined value relative to another voltage. When the power supply voltage is lower than the predetermined value, the transistors are enabled.

Some embodiments include DRAMs. In some DRAMs, in read and refresh operations the sense amplifiers drive the bit lines in order to write the information being read from the memory back to the memory. Since bit lines have significant capacitance, large current is needed to charge the sense amplifiers fast, especially for low power supply voltages. Therefore, the transistors charging the sense amplifiers have a large combined gate width/length dimension. However, if the power supply voltage is high, the transistor switching generates much noise. Therefore, some of the transistors charging the sense amplifiers are disabled by a signal generated from the power supply voltage.

Some embodiments are suitable for both 3.3V and 5.0V power supplies.

Some embodiments operate reliably in the presence of power supply voltage variations.

Other features and advantages of the invention are described below. The invention is defined by the appended claims.

DESCRIPTION OF PREFERRED EMBODIMENTS

Figure 1:
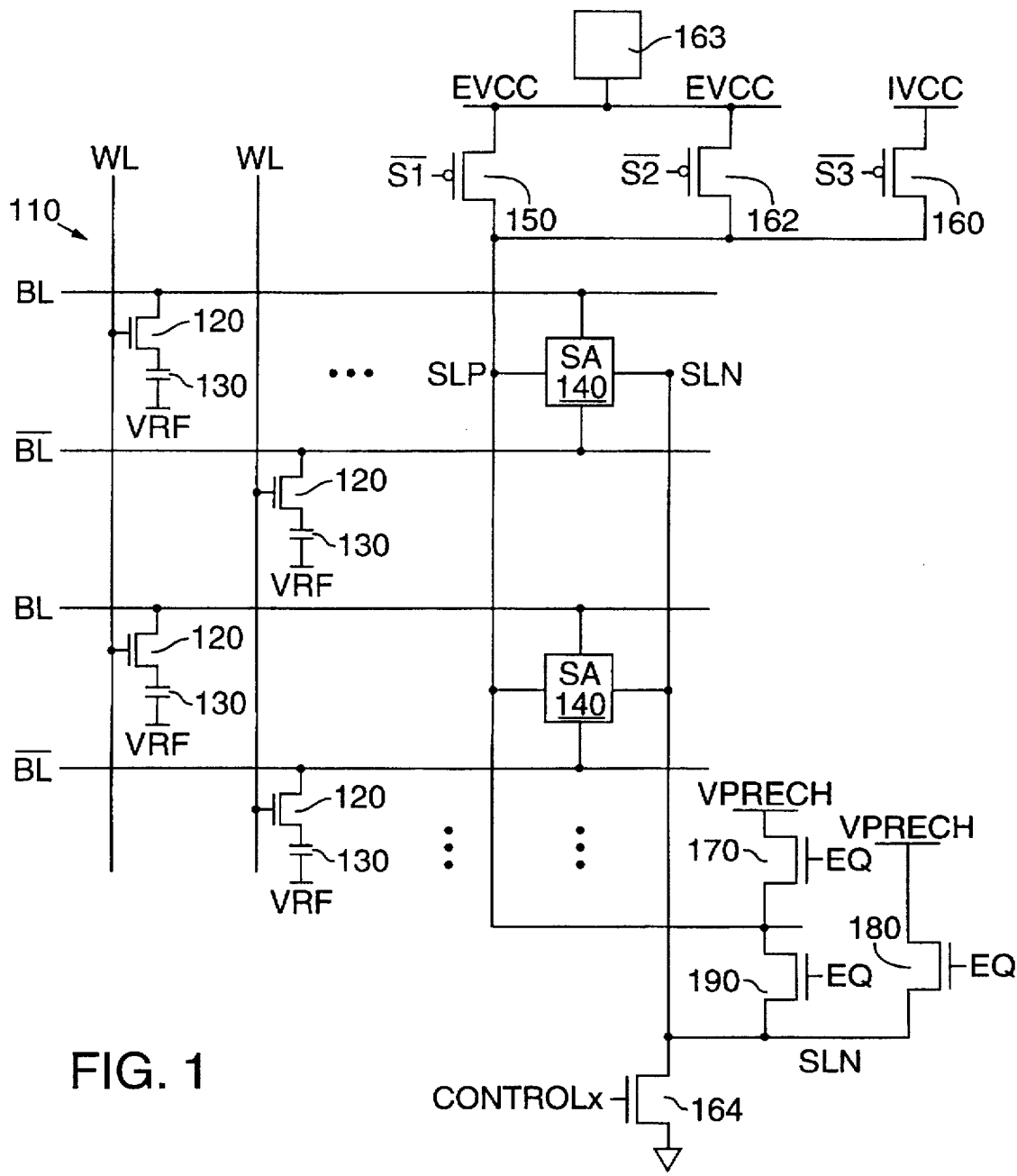
FIG. 1 is a diagram of a DRAM according to the present invention.

FIG. 1 diagrams a DRAM 110. In each DRAM cell, NMOS transistor 120 has a source connected to one plate of capacitor 130. The other plate of capacitor 130 is connected to a voltage plate having a constant voltage VRF. In some embodiments, VRF is about one-half of an internal power supply voltage IVCC generated from an external power supply voltage EVCC. In other embodiments, VRF is ground.

The DRAM cells are arranged in an array. Word lines WL extend along the array rows. Each column of the array includes a bit line BL and a complementary bit line $\overline{BL}$. In each column, the gate of each transistor 120 is connected to a separate word line WL. The drain of every other transistor 120 is connected to the bit line BL. The drains of the remaining transistors 120 are connected to the bit line $\overline{BL}$.

Figure 4:
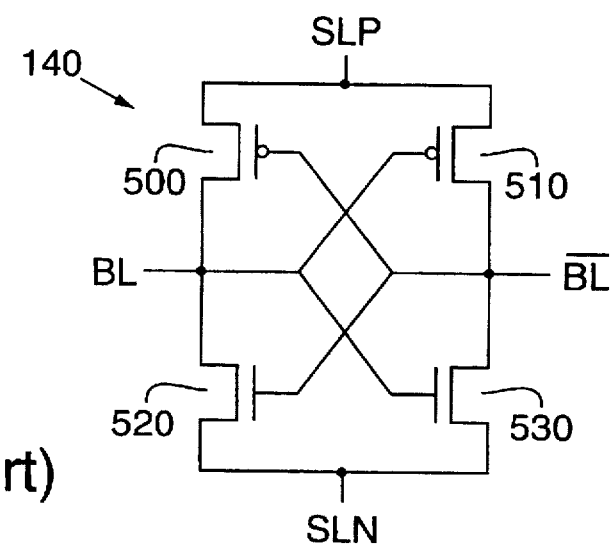
FIG. 4 is a diagram of a prior art sense amplifier used in the DRAM of FIG. 1.

In each column, the bit lines BL and $\overline{BL}$ are connected to input/output nodes of a respective sense amplifier 140 (FIG. 4). One power supply input of each sense amplifier 140 is connected to node SLP common to all the sense amplifiers. Another power supply input is connected to node SLN also common to all the sense amplifiers. During amplification, node SLP provides a high voltage to amplifiers 140. Node SLN provides a low voltage.

Node SLP is connected to the external power supply voltage EVCC through PMOS transistor 150. The gate of transistor 150 receives a signal $\overline{S1}$. Node SLP is connected to the internal power supply voltage IVCC through PMOS transistor 160. The gate of transistor 160 receives a signal $\overline{S3}$. IVCC is lower in magnitude than EVCC. IVCC is used instead of EVCC to reduce power consumption and the stress on DRAM devices. IVCC is generated from EVCC by a voltage regulator using methods known in the art. In some 5V memories, that is, memories designed for the nominal EVCC value of 5V, when EVCC is 4V to 6V then IVCC is about 3.5V. In some 3.3V memories, when EVCC is 3.3V, then IVCC is 3.3V.

Node SLP is also connected to the external voltage EVCC through PMOS transistor 162. The gate of transistor 162 receives a signal $\overline{S2}$. As described below, signal $\overline{S2}$ is generated from the external power supply voltage EVCC so that transistor 162 is turned on only if EVCC is low.

In some embodiments, DRAM 110 is an integrated circuit. The external voltage EVCC is received on an external pin 163 of the integrated circuit. Pin 163 is connected to the sources of transistors 150, 162 by a conductive line (or lines), using methods known in the art.

Node SLN is connected to a voltage VSS (typically ground) through NMOS transistor 164 whose gate receives a signal CONTROLx.

3

During amplification, each sense amplifier 140 drives one of the respective bit lines BL, $\overline{BL}$ to IVCC and the other one of the bit lines to VSS. The current to drive bit lines to IVCC is supplied by transistors 150, 160, 162 through node SLP. The current to drive bit lines to VSS is sunk by transistor 164 through node SLN.

Figure 2:
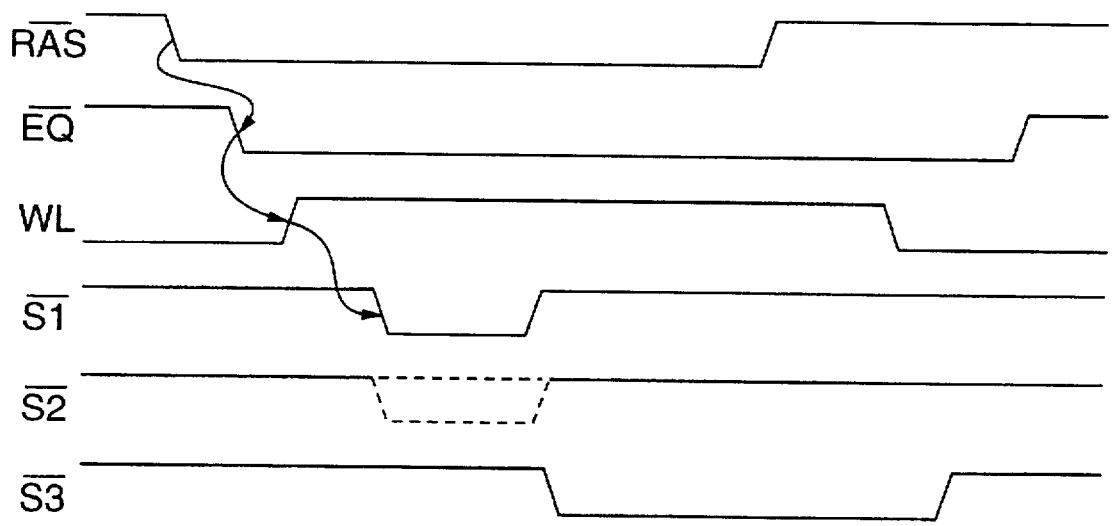
FIG. 2 is a timing diagram for the DRAM of FIG. 1.

FIG. 2 shows timing for read and refresh operations in memory 110. Before the operation starts, the bit lines BL, $\overline{BL}$ and nodes SLN, SLP are precharged to a precharge voltage VPRECH. Voltage VPRECH is between VSS and the internal voltage IVCC. VPRECH is generated from IVCC. Precharge voltage VPRECH is connected to node SLP through NMOS transistor 170 (FIG. 1) and to node SLN through NMOS transistor 180. Node SLP is connected to node SLN through NMOS transistor 190. The gates of transistors 170, 180, 190 receive equalization signal EQ. Before the read operation starts, equalization signal EQ is high. Consequently, nodes SLP and SLN are precharged to VPRECH. Signals $\overline{S1}$, $\overline{S2}$, $\overline{S3}$ are high ($\overline{S1}$ and $\overline{S2}$ are at EVCC, $\overline{S3}$ is at IVCC). Therefore, transistors 150, 160, 162 are off. CONTROLx is low (at VSS). Therefore, transistor 164 is off.

At the start of the read or refresh operation, row address strobe signal $\overline{RAS}$ becomes low (FIG. 2). In response, signal EQ becomes low turning off the precharge transistors 170, 180, 190. The transistors (not shown) that precharge the bit lines BL, $\overline{BL}$ are also turned off. Then a selected word line WL becomes high. Transistors 120 in the corresponding row turn on. The charge on the corresponding capacitors 130 becomes shared with the respective bit lines BL or $\overline{BL}$. In each column, bit lines BL, $\overline{BL}$ separate.

Then at a later time, amplification begins. Signal CONTROLx becomes high turning on transistor 164. Signal $\overline{S1}$ becomes low turning on transistor 150. Signals CONTROLx and $\overline{S1}$ are generated from WL using methods known in the art. If the external voltage EVCC is low, the signal $\overline{S2}$ becomes also low to turn on transistor 162. Transistor 162 makes the node SLP charge to the voltage IVCC faster. If the external voltage EVCC is high, the signal $\overline{S2}$ remains high, and transistor 162 remains off, reducing memory noise. Transistor 150 is sufficiently large to charge the node SLP fast when EVCC is high. Transistor 162 is sized to provide sufficient speed for the low EVCC value. See the Appendix below giving transistor sizes for some embodiments.

When the node SLP has been pulled up to about the internal voltage IVCC, signal $\overline{S1}$ becomes high. Signal $\overline{S2}$ also becomes (or remains) high. Transistors 150 and 162 are therefore off. Signal $\overline{S3}$ becomes low to turn on transistor 160. Transistor 160 sustains the IVCC voltage on the bit lines. Signal $\overline{S3}$ is described in U.S. patent application Ser. No. 08/695,058 entitled "Methods And Apparatus For Charging A Sense Amplifier", filed by L. Liu et al. on Aug. 9, 1996 and incorporated herein by reference. In that application, signal $\overline{S3}$ is called CONTROLy, and signal $\overline{S1}$ is called CONTROLz.

As is clear from FIG. 2, if EVCC is low, signal $\overline{S2}$ is asserted or deasserted simultaneously with signal $\overline{S1}$. Thus, transistors 160 and 162 turn on and off at the same time. If EVCC is high, signal $\overline{S2}$ remains deasserted throughout the read or refresh operation.

Figure 3:
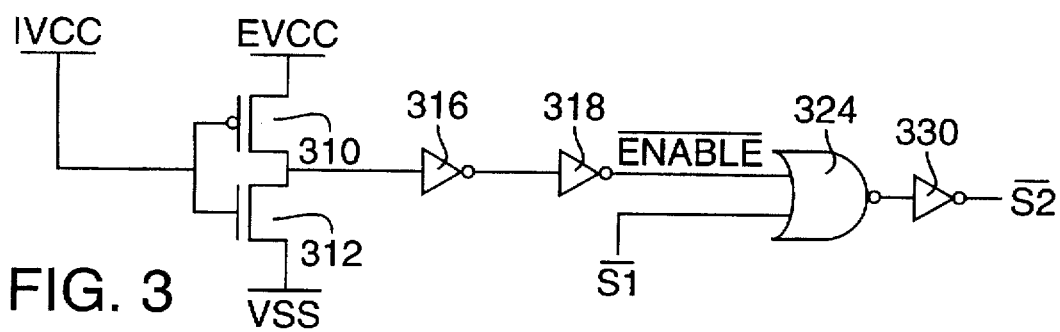
FIG. 3 is a circuit diagram of a circuit generating a control signal for the DRAM of FIG. 1.

FIG. 3 shows a circuit generating the signal $\overline{S2}$. PMOS transistor 310 has its source connected to EVCC and its gate connected to IVCC and to the gate of NMOS transistor 312. The source of transistor 312 is connected to VSS. The drains of transistors 310 and 312 are connected to each other and to the input of inverter 316. The output of inverter 316 is connected to the input of inverter 318. The output of inverter 318 provides the signal $\overline{ENABLE}$ delivered to one input of two-input NOR gate 324. The other input of gate 324 receives the signal $\overline{S1}$. The output of gate 324 is connected to the input of inverter 330. The output of inverter 330 provides the signal $\overline{S2}$.

If EVCC is sufficiently high, transistor 310 will source more current than is sunk by transistor 312, and the input of inverter 316 will charge to at least the trip voltage of the inverter. In some embodiments, transistor 310 is larger than transistor 312, and the inverter 316 will be tripped by transistor 310 as long as EVCC is higher than IVCC by the threshold voltage of transistor 310 (0.9V to 1.0V in some embodiments). See the Appendix. Inverters 316, 318, 330 and NOR gate 324 are CMOS circuits powered by EVCC. Therefore, the high EVCC value causes the signal $\overline{S2}$ to remain at EVCC.

If the external voltage EVCC is not sufficiently high to trip inverter 316, for example, if EVCC does not exceed IVCC by at least the threshold voltage of transistor 310, transistor 312 keeps the input of inverter 316 below the inverter trip voltage. The output $\overline{ENABLE}$ of inverter 318 becomes high, enabling the signal $\overline{S2}$ to track $\overline{S1}$. Consequently, the signal $\overline{S2}$ will have the same voltage level as signal $\overline{S1}$.

The threshold voltage of transistor 310 is chosen to keep the transistor 162 off when EVCC becomes so high that the noise becomes unacceptable.

Because the sense amplifier charging circuit is adapted to different EVCC levels, the circuit is reliable in the presence of EVCC variations during circuit operation.

In some embodiments, a third MOS transistor (not shown) is connected in series with transistors 310 and 312 between EVCC and VCC. The gate of the third transistor is controlled by $\overline{RAS}$ so that when $\overline{RAS}$ is low, the transistor is on, and when $\overline{RAS}$ is high, the transistor is off. The third transistor eliminates DC current consumption through transistors 310, 312 when EVCC is above the transistor 310 threshold voltage relative to IVCC.

In some embodiments, the EVCC value enabling the transistor 162 is derived from some other voltage than IVCC, for example, from ground. Thus, in some embodiments, transistors 310 and 312 are replaced by a diode whose cathode receives the voltage EVCC and whose anode is connected to the input of inverter 316. In some embodiments, the diode is formed from one or more PMOS transistors each of which has its gate connected to its drain, as is known in the art. Transistor 162 becomes enabled during the read operation if, and only if, EVCC is higher than ground by the value of the voltage at which the diode starts conducting.

FIG. 4 is a circuit diagram of one embodiment of a sense amplifier 140. Such sense amplifiers are known in the art. Node SLP is connected to the sources of PMOS transistors 500, 510. The drains of transistors 500, 510 are connected to respective bit lines BL, $\overline{BL}$ and to the drains of respective NMOS transistors 520, 530. The sources of transistors 520, 530 are connected to node SLN. The gates of transistors 500, 520 are connected to bit line $\overline{BL}$. The gates of transistors 510, 530 are connected to bit line BL.

The embodiments described above and in the Appendix below illustrate but do not limit the invention. In particular, the invention is not limited by any voltage levels or transistor sizes or by any circuitry. Non-CMOS inverters and logic gates are used in some embodiments. In some embodiments, transistor 150, 160, or 162 is implemented as several transistors connected in parallel. Other embodiments and variations are within the scope of the invention, as defined by the appended claims.

APPENDIX

The table below gives transistor width/length dimensions for some embodiments of FIGS. 1 and 3. All the dimensions are in micrometers. Where the dimension is a single number, it is the gate width, and the gate length is presumed to be 0.6 µm. For example, the gate width/length of transistor 150 is 500/0.6 µm. All logic gates and inverters are CMOS circuits. For logic gates and inverters, "P=x" indicates the dimension "x" of the PMOS transistors, and "N=y" indicates the dimension "y" of the NMOS transistors. "x" and "y" can be single numbers or pairs of numbers separated by a slash, as described above.

| DEVICE | DIMENSIONS |
| --- | --- |
| Each of transistors 150, 160, 162 | 500 |
| Transistor 310 | 4/1 |
| Transistor 312 | 4/50 |
| Inverter 316 | P = 8/10, N = 4/10 |
| Inverter 318 | P = 8, N = 4 |
| Gate 324 | P = 20, N = 5 |
| Inverter 330 | P = 50, N = 25 |

PMOS and NMOS transistor threshold voltages are about 0.9V to 1.0 V. (We use the term "PMOS transistor threshold voltage" for the absolute value of the PMOS transistor threshold voltage.)

In some embodiments, due to a long gate of transistor 312 (50 µm), DC current consumption in the circuit of FIG. 3 is below 15 µA. The output of inverter 318 switches at the EVCC value of about 4.5V for IVCC=3.3V. EVCC is allowed to change between 3.3V and 6.5V.

We claim:

1. A circuit comprising:

a sense amplifier having a node for receiving power;

a first circuit for charging the node from a first voltage; and a second circuit for charging the node from the first voltage when the first voltage is lower in magnitude than a predetermined value relative to a second voltage, the second circuit being disabled from charging the node when the first voltage is higher in magnitude than the predetermined value relative to the second voltage.

2. The circuit of claim 1 further comprising a circuit for generating a signal SIG1 from the first voltage, the signal SIG1 indicating whether the first voltage magnitude is above or below the predetermined value relative to the second voltage;

wherein the second circuit is enabled to charge the node from the first voltage when the signal SIG1 indicates that the first voltage magnitude is below the predetermined value relative to the second voltage, and wherein the second circuit is disabled from charging the node from the first voltage when the signal SIG1 indicates that the first voltage magnitude is higher than the predetermined value relative to the second voltage.

3. The circuit of claim 2 wherein when the signal SIG1 enables the second circuit, then: (1) the second circuit charges the node from the first voltage simultaneously with the first circuit charging the node from the first voltage, and (2) the second circuit does not charge the node from the first voltage when the first circuit does not charge the node from the first voltage.

4. The circuit of claim 2 wherein the second circuit includes a transistor connected between the node and the first voltage, the transistor having a gate connected to receive a signal generated from the signal SIG1.

5. The circuit of claim 1 further comprising a plurality of memory cells and at least one bit line connected to one or more of the memory cells, the sense amplifier being for sensing the state of the bit line.

6. The circuit of claim 5 wherein the memory cells are DRAM cells.

7. The circuit of claim 1 wherein the first voltage is to be provided by a power supply external to the circuit;

the circuit further comprising a voltage regulator for generating the second voltage from the first voltage, the second voltage being lower in magnitude than the first voltage.

8. The circuit of claim 1 wherein the second voltage is a ground voltage.

9. A method for charging a sense amplifier node, the method comprising:

enabling a first circuit to charge the node from a first voltage; and enabling a second circuit to charge the node from the first voltage when the first voltage is lower in magnitude than a predetermined value relative to a second voltage, and disabling the second circuit from charging the node from the first voltage when the first voltage is higher in magnitude than the predetermined value relative to the second voltage.

10. The method of claim 9 further comprising generating a signal SIG1 from the first voltage, the signal SIG1 indicating whether the first voltage is higher or lower in magnitude than the predetermined value relative to the second voltage;

wherein the second circuit is enabled to charge the node from the first voltage when the signal SIG1 indicates that the first voltage is lower in magnitude than the predetermined value relative to the second voltage, and wherein the second circuit is disabled from charging the node from the first voltage when the signal SIG1 indicates that the first voltage is higher in magnitude than the predetermined value relative to the second voltage.

11. The method of claim 10 wherein when the signal SIG1 enables the second circuit, then: (1) the second circuit charges the node from the first voltage simultaneously with the first circuit charging the node from the first voltage, and (2) the second circuit does not charge the node from the first voltage when the first circuit does not charge the node from the first voltage.

12. The method of claim 9 further comprising:

precharging the node to a precharge voltage to disable the sense amplifier;

asserting a signal SIG2 indicating a start of an operation in a memory containing the sense amplifier;

in response to the signal SIG2, generating a first signal to cause the first circuit to charge the node; and generating a second signal from the first signal and the first voltage such that when the first voltage is lower in magnitude than the predetermined value relative to the second voltage, the first signal cause the first circuit to charge the node from the first voltage simultaneously with the second signal causing the second circuit to charge the node from the first voltage. and the first signal causes the first circuit not to charge the node from the first voltage simultaneously with the second signal causing the second circuit not to charge the node from the first voltage.

13. The method of claim 11 wherein the memory is a DRAM.

14. The method of claim 13 wherein the operation is a memory read or refresh operation.

* * * * *

UNITED STATES PATENT AND TRADEMARK OFFICE
CERTIFICATE OF CORRECTION

PATENT NO.    :   5,768,200
ISSUE DATE    :   June 16, 1998
INVENTOR(S)   :   Liu, Lawrence; Murray, Michael; Li, Li-Chun It is certified that error appears in the above-identified patent and that said Letters Patent is hereby corrected as shown below:

Column 8, line 1 (Claim 13) change "Claim 11" to --Claim 12--.

Signed and Sealed this

Fourth Day of January, 2000

Attest:

Attesting Officer

*Acting Commissioner of Patents and Trademarks*